United States Patent [19]

Misu et al.

[11] Patent Number: 4,902,602

[45] Date of Patent: Feb. 20, 1990

[54] LIGHT-SENSITIVE COMPOSITION AND PRESENSITIZED PLATE WITH LIGHT-SENSITIVE DIAZO RESIN, ACIDIC BINDER AND COMPOUND WITH PIVALOYL GROUP

[75] Inventors: Hiroshi Misu; Koichiro Aono; Yoshimasa Aotani, all of Shizuoka, Japan

[73] Assignee: Fuji Photo Film Co., Ltd., Minami-ashigara, Japan

[21] Appl. No.: 182,242

[22] Filed: Apr. 15, 1988

[30] Foreign Application Priority Data

Apr. 21, 1987 [JP] Japan .................................. 62-98359

[51] Int. Cl.$^4$ ................................................ G03C 1/60
[52] U.S. Cl. .................................... 430/175; 430/176; 430/157; 430/158; 430/302
[58] Field of Search ............... 430/175, 176, 158, 157, 430/302

[56] References Cited

U.S. PATENT DOCUMENTS

| | | | |
|---|---|---|---|
| 3,869,292 | 3/1975 | Peters ................................. | 430/192 |
| 3,890,152 | 6/1975 | Ruckert et al. ..................... | 430/175 |
| 4,245,027 | 1/1981 | Takeda et al. ...................... | 430/141 |
| 4,268,609 | 5/1981 | Shiba et al. . | |
| 4,275,138 | 6/1981 | Kita et al. ........................... | 430/175 |
| 4,337,307 | 6/1982 | Neubauer ........................... | 430/175 |
| 4,347,305 | 8/1982 | Shiba et al. ........................ | 430/156 |
| 4,477,552 | 10/1984 | Day et al. .......................... | 430/308 |

*Primary Examiner*—Charles L. Bowers, Jr.
*Attorney, Agent, or Firm*—Burns, Doane, Swecker & Mathis

[57] ABSTRACT

Light-sensitive compositions comprise a light-sensitive diazo resin, a binder and a compound having a pivaloyl group. Lithographic printing plates prepared by using the light-sensitive compositions of the invention are excellent in ink receptivity.

14 Claims, No Drawings

LIGHT-SENSITIVE COMPOSITION AND PRESENSITIZED PLATE WITH LIGHT-SENSITIVE DIAZO RESIN, ACIDIC BINDER AND COMPOUND WITH PIVALOYL GROUP

BACKGROUND OF THE INVENTION (1) Field of the Invention

The present invention relates to light-sensitive compositions, particularly to light-sensitive compositions suitable for use in a presensitized plate from which a lithographic printing plate is to be prepared. More specifically, the invention relates to light-sensitive compositions suitable for use in preparation of presensitized plates having an excellent ink receptivity.

(2) Prior Art

Most light-sensitive substances actually used in presensitized printing materials are diazonium compounds, and the most commonly used conventional substances among the diazonium compounds are diazo resins (i.e., diazonium salt condensates) represented by formaldehyde condensates of p-diazodiphenylamine.

Compositions of the light-sensitive layer of presensitized plates using diazo resins can be classified into two types, i.e, one comprising a diazo resin alone, namely those not using a binder, as disclosed, for example, in U.S. Pat. No. 2,714,066, and another comprising a mixture of an diazo resin and a binder, as disclosed, for example, in U.S. Pat. No. 4,275,138. Recently, many presensitized plates using diazonium compounds have a light-sensitive layer comprising a diazonium compound and a binder so as to impart a high printing durability to the plates.

Known light-sensitive layers of this type include, as disclosed in U.S. Pat. No. 4,275,138, so-called alkali development type layers where unexposed areas are removed (developed) with an aqueous alkali developing solution, and so-called solvent development type layers where unexposed areas are removed with an organic solvent series developing solution. Recently, in view of safety and worker hygiene, alkali development type light-sensitive layers have received attention, and it is mainly the properties of the binder determines the type to which the light-sensitive layer belongs. Methods of making a binder having an alkali development property include a method as disclosed in the aforementioned U.S. Pat. No. 4,275,138 where monomers containing carboxylic acid groups are copolymerized, a method as disclosed in U.S. Pat. No. 2,861,058 where polyvinyl alcohol is reacted with a cyclic acid anhydride such as phthalic anhydride through hydroxyl groups of the former to introduce carboxylic acid groups in the polymer, etc. However, the resulting light-sensitive layers were inadequate in ink receptivity which is an important characteristic of a lithographic printing plate.

Thus, a method where a high molecular compound is added has been proposed for improvement of ink receptivity, as disclosed in U.S. Pat. No. 4,294,905, but this method is still inadequate, and further improvement has been desired.

SUMMARY OF THE INVENTION

The object of the invention is to provide light-sensitive compositions suitable for making presensitized plates which are capable of alkali development and have very enhanced ink receptivity.

The above object of the invention has been attained by a light-sensitive composition comprising a light-sensitive diazo resin, a binder and a compound having a pivaloyl group.

PREFERRED EMBODIMENTS OF THE INVENTION

Pivaloyl group-containing compounds used in the invention are compounds obtained by pivaloylating a compound having groups reactive to a pivalic acid derivative such as pivalic acid or pivaloyl chloride (e.g., hydroxyl groups, amino groups or thiol groups) with such a pivalic acid derivative, or polymers containing monomer units having a pivaloyl group. Examples of such pivaloyl group-containing compounds are as follows:

(A) Pivaloyloxystyrene unit- or pivaloyloxy-α-methylstyrene unit-containing polymers, for example, pivalic esters of a homopolymer of p-hydroxystyrene or p-hydroxy-α-methylstyrene, or a copolymer thereof with a copolymerizable monomer such as styrene, acrylonitrile, methyl methacrylate, hydroxyethyl methacrylate or hydroxyethyl acrylate;

(B) Vinyl pivalate unit-containing polymers, for example, homopolymers or copolymers of vinyl pivalate, or pivalic esters of a polymer containing vinyl alcohol units;

(C) Pivalic esters of phenol resins;

(D) Pivalic esters of a condensate of a polyphenol such as pyrogallol or resorcin with a ketone such as acetone or methyl ethyl ketone; and (E) Bispivalic ester of bisphenol A.

Polymers among the above pivaloyl group-containing compounds have a molecular weight of preferably 500 to 50,000, more preferably 10,000 to 30,000. The amount of such a pivaloyl group-containing compound to be added is preferably 0.1 to 50 weight %, more preferably 0.5 to 25 weight % based on the binder. In an amount of less than 0.1 weight %, improvement of ink receptivity is inadequate and in an amount exceeding 50 weight %, deterioration of developing properties becomes marked.

Light-sensitive diazo resins used in the invention are diazo resins represented by a condensate of an aromatic diazonium salt and an active carbonyl group-containing compound such as formaldehyde.

Examples of the above diazo resins include, for example, an organic solvent soluble diazo resin inorganic acid salt which is a reaction product of a condensate of p-diazodiphenylamine and an aldehyde such as formaldehyde or acetaldehyde with a hexafluorophosphate or tetrafluoroborate; and an organic solvent soluble diazo resin organic acids salt which is a reaction product of the above condensate with a sulfonic acid or a salt thereof such as p-toluenesulfonic acid or a salt thereof, propylnaphthalenesulfonic acid or a salt thereof, butylnaphthalenesulfonic acid or a salt thereof, dodecylbenzenesulfonic acid or a salt thereof, or 2-hydroxy-4-methoxybenzophenone-5-sulfonic acid or a salt thereof, as disclosed in U.S. Pat. No. 3,300,309.

Diazo compounds of high molecular weight containing 20 mole % or more of hexamer as disclosed in Japanese Patent Unexamined Published Application (hereinafter referred to as "J.P. KOKAI") No. 59-78340 are particularly preferred.

Compounds obtained by condensing 3-methoxy-4-diazodiphenylamine with 4,4'-bis-methoxymethyldiphenyl ether and converting the condensate to a salt with mesitylenesulfonic acid as disclosed in Canadian Pat. No. 1,172,492 are also suitable.

Binders used in the invention are organic high molecular compounds which have an acid value of 10 to 200, preferably 20 to 100, are substantially water insoluble (namely, insoluble in neutral or acidic aqueous solutions) and have a film-forming property. Preferably, such binders have, in addition to the above properties, another property that they can dissolve or swell in aqueous alkali solution series developing solutions, and can be photohardened in coexistence with the above-mentioned light-sensitive diazo resin, whereby they are converted to compounds insoluble or not swelling in the above developing solutions. Acid value of less than 10 makes development difficult, and acid value exceeding 200 makes image intensity at development strikingly weak.

Particular preferred examples of binders are copolymers containing acrylic acid, methacrylic acid, crotonic acid or maleic acid as an essential component, for example, multicomponent copolymers consisting of 2-hydroxydiethyl acrylate (or 2-hydroxyethyl methacrylate), acrylonitrile (or methacrylonitrile), acrylic acid (or methacrylic acid), and, if necessary, another copolymerizable monomer, as disclosed in U.S. Pat. No. 4,123,276; multicomponent copolymers consisting of acrylic acid (or methacrylic acid) esterified with a group which has an hydroxyl group at the end and contains a dicarboxylic acid ester residue, acrylic acid (or methacrylic acid), and, if necessary, another copolymerizable monomer, as disclosed in J.P. KOKAI No. 53-120903; multicomponent copolymers consisting of a monomer having an aromatic hydroxyl group at the end (e.g., N-(4-hydroxyphenyl)methacrylamide), acrylic acid (or methacrylic acid), and, if necessary, another copolymerizable monomer, as disclosed in J.P. KOKAI No. 54-98614; and multicomponent copolymers consisting of alkyl acrylate, acrylonitrile (or methacrylonitrile) and an unsaturated carboxylic acid. In addition, acidic polyvinyl alcohol derivatives and acidic cellulose derivatives are also useful. Further, binders disclosed in U.S. Pat. Nos. 3,732,105, 4,387,151 and 4,631,245, and J.P. KOKAI No. 62-58242 and G.B. 2,185,120A where polyvinyl acetal or polyurethane have been made alkali soluble are also useful.

Light-sensitive compositions of the invention each suitably contains 3 to 30 weight % of the diazo resin and 97 to 70 weight % of the binder based on the total amount of them.

While the sensitivity becomes higher in proportion as the content of the diazo resin is smaller, a content lower than 3 weight % is inadequate for photohardening the binder and in such a case the photohardened film is swollen by the developing solution at development to weaken the film. On the other hand, a content of the diazo resin greater than 30 weight % reduces sensitivity and thus causes practical problems. Thus a more preferred content range is 5 to 25 weight % of a diazo resin and 95 to 75 weight % of a binder.

Light-sensitive compositions of the invention may further contain various additives. For example, there can be added thereto an alkyl ether (e.g., ethylcellulose or methylcellulose) for improving coating properties; a fluorine surfactant or a silicone surfactant (e.g., one disclosed in J.P. KOKAI No. 57-178242, G.B. 2,023,858A, U.S. Pat. No. 4,510,227, or EP239,082A); a plasticizer for bestowing flexibility and abrasion resistance on the paint film (e.g., tricresyl phosphate, dihexyl phthalate, dioctyl phthalate, trioctyl phosphate, tributyl phosphate, tributyl citrate, polyethylene glycol or polypropylene glycol); an acridine dyestuff, a cyanine dyestuff, a styryl dyestuff, a triacrylmethane dyestuff or a pigment (e.g., phthalocyanine) (e.g., one disclosed in Japanese Patent Publication for Opposition Purpose (hereinafter referred to as "J.P. KOKOKU") No. 56-30859 or U.S. Pat. No. 4,391,894) as a coloring substance for making the image areas after development visible; and/or a general stabilizer for diazo resins (e.g., phosphoric acid, phosphorous acid, pyrophosphoric acid, oxalic acid, tartaric acid, malic acid, pyridinedicarboxylic acid, boric acid, benzenesulfonic acid, toluenesulfonic acid, naphthalenesulfonic acid, alkylnaphthalenesulfonic acid, a homopolymer or copolymer of acrylic acid, a homopolymer or copolymer of vinylphosphonic acid, a homopolymer or copolymer of vinylsulphonic acid, 5-nitronaphthalene-1-phosphonic acid, 4-chlorophenoxymethylphosphonic acid, sodium phenyl-methyl-pyrazolonesulfonate, 2-phosphonobutanetricarboxylic acid-1,2,4,1-phosphonoethanetricarboxylic acid-1,2,2, or 1-hydroxyethane-1,1-disulfonic acid). The amounts of these additives to be added differ according to purpose of use, but are each in general 0.5 to 30 weight % based on total solid matter of the light-sensitive composition.

A light-sensitive composition of the invention may be dissolved in an appropriate organic solvent and applied onto a support having phydrophilic surface so that the applied amount after drying becomes 0.3 to 5 g/m$^2$, in order to obtain a presensitized plate. Concentration of the light-sensitive composition in a coating solvent desirably ranges from 1 to 50 weight %. Coating solvents to be used include, for example, methanol, ethanol, butanol, ethylene chloride, chlorobenzene, tetrahydrofuran, acetone, methyl ethyl ketone, cyclohexanone, ethyl acetate, butyl acetate, methyl lactate, ethyl lactate, ethylene glycol monomethyl ether, ethylene glycol dimethyl ether, ethylene glycol monomethyl ether, 1-methoxy-2-propanol, dimethylformamide, dimethylsulfoxide, γ-butyrolactone and diacetone alcohol, mixed solvents thereof, and mixed solvent prepared by adding a small amount of a solvent which does not dissolve the diazo resin or binder such as water or toluene to one of the solvents or mixed solvents.

Supports suitable for providing light-sensitive compositions of the invention are dimensionally stable plate materials. Such dimensionally stable plate materials include conventional supports of printing plates and such supports may be suitably used in the invention. Examples of such supports include papers; papers laminated with a plastic (e.g., polyethylene, polypropylene, polystyrene, etc.); plates of a metal such as aluminum (including aluminum alloys), zinc or copper; films of a plastic such as cellulose diacetate, cellulose triacetate, cellulose propionate, cellulose, butyrate, cellulose acetate butyrate, cellulose nitrate, polyethylene terephthalate, polyethylene, polystyrene, polypropylene, polycarbonate or polyvinyl acetal; papers or plastic films laminated with or deposited with a metal as above-mentioned; etc. Among these supports, aluminum plates are particularly preferable since they are very dimensionally stable and low in price.

Among aluminum plates, aluminum plates subjected to roughening treatment are preferable and may be made by various methods. For example, the surface of an aluminum plate is grained by wire brush graining, brush graining where roughening is carried out using a nylon brush while a slurry of abrasive particles is poured, ball graining, chemical graining or electrolytic graining or a combined graining where these roughening methods are appropriately combined. Then, though not absolutely necessary, it is preferable that the roughened aluminum plate be anodized in sulfuric acid, phosphoric acid, oxalic acid, boric acid, chromic acid or sulfamic acid or a mixed solvent thereof using a direct current or alternating current power source to provide a strong passive state film on the aluminum surface. Such a passive state film itself makes the aluminum surface hydrophilic, but it is preferable to further carry out a hydrophilizing treatment. Particularly preferred hydrophilizing treatments include a potassium fluorozirconate treatment disclosed in U.S. Pat. No. 2,946,638, a phosphomolybdate treatment disclosed in U.S. Pat. No. 3,201,247, a polyacrylic acid treatment disclosed in West Germany Pat. No. 1,091,433, a polyvinylphosphonic acid treatment disclosed in West Germany Pat. No. 1,134,093 or GB Pat. No. 1,230,447, a phosphonic acid treatment disclosed in J.P. KOKOKU No. 44-6409, a phytic acid treatment disclosed in U.S. Pat. No. 3,307,951, a combined treatment with a hydrophilic organic high molecular compound and a divalent metal disclosed in J.P. KOKAI No. 58-16893 or 58-18291, and an undercoat treatment with a water soluble polymer having sulfonic acid groups. As another hydrophilizing treatment, silicate electrodeposition disclosed in U.S. Patent No. 3,658,662 may be used.

The amount of a light-sensitive composition of the invention to be applied onto a roughened aluminum plate is preferably 0.3 to 5 g/m$^2$, more preferably 0.5 to 3.5 g/m$^2$ as solid matter Solid matter concentration in the light-sensitive composition solution giving such a coating amount is suitably 1 to 50 weight %, preferably 2 to 20 weight %. As a method for applying a light-sensitive composition solution onto an aluminum plate, a conventional method such as roll coating, bar coating, spray coating, curtain coating or spin coating may be used. The applied light-sensitive composition solution is preferably dried at 50° to 120° C. Drying may be carried out at a high temperature after previous drying at a low temperature, or directly at a high temperature.

A presensitized plate having a light-sensitive composition layer which was applied onto a roughened aluminum plate and dried is subjected to imagewise exposure to light and development in an aqueous alkali solution type developing solution to obtain a relief negative to the transparency. Light sources suitable for exposure to light include a carbon arc lamp, a mercury lamp, a xenon lamp, a metal halide lamp, a strobo lamp, an ultraviolet laser ray, etc.

The aqueous alkali solution type developing solutions used for the above presensitized plates are those having a pH of 8 to 13 and containing 75 weight % or more of water, and such solution may further contain a small amount of an organic solvent, a surfactant, an alkali agent, a background contamination inhibitor, a water softener and/or the like according to necessity. As such an aqueous alkali solution type developing solution, there can be used an aqueous weak alkali solution prepared by mixing an organic solvent having a solubility in water of 10 weight % or less at ordinary temperature (e.g., benzyl alcohol, or ethylene glycol monophenyl ether); an alkali agent (e.g., triethanolamine, diethanolamine, monoethanolamine, sodium phosphate or sodium carbonate); an anionic surfactant (e.g., an aromatic sulfonate, a dialkylsulfosuccinate, an alkylnaphthalenesulfonate, an aliphatic acid salt or an alkyl sulfate); a nonionic surfactant (e.g., a polyoxyethylene alkyl ether, a polyoxyethylene alkyl aryl ether or a polyoxyethylene-polyoxypropylene block polymer); water; and optional compound(s) selected from among a background contamination inhibitor (e.g., sodium sulfite or sulfopyrazolone sodium salt), and water softener (e.g., tetrasodium ethylenediaminetetraacetate or trisodium nitrilotriacetate) as is disclosed, for example, in J.P. KOKAI Nos. 51-77401; 51-80228: or 55-52054 or U.S. Pat. No. 4,186,006.

Light-sensitive compositions of the invention can be developed by an alkali developer and have a high ink receptivity. Thus, light-sensitive compositions of the invention are suitable for making presensitized plates, and presensitized plates having provided thereon such a light-sensitive composition can widely and advantageously be used.

The invention is described below by non-limiting examples.

EXAMPLE 1

An aluminum plate was immersed in an aqueous sodium phosphate solution to remove grease therefrom, subjected to brush graining, electrolytically etched, anodized in sulfuric acid, and immersed in an aqueous sodium silicate solution for hydrophilization.

This hydrophilized aluminum plate was coated with light-sensitive composition A having the following composition to obtain a presensitized plate (A). The applied amount was 1.5 g.m/$^2$.

| Light-sensitive composition A | |
| --- | --- |
| Binder-1 | 5.0 g |
| Diazo resin-1 | 0.5 g |
| Pivaloyl group-containing compound-1 | 0.1 g |
| Victoria Pure Blue-BOH | 0.15 g |
| Sodium t-butylnaphthalenesulfonate | 0.15 g |
| Phosphorous acid | 0.1 g |
| FC-430 (surfactant manufactured from 3M) | 0.05 g |
| Ethylene glycol monomethyl ether | 60 g |
| Methanol | 20 g |
| Methyl ethyl ketone | 40 g |

Diazo resin-1 used herein is hexafluorophosphate of the condensate of p-diazodiphenylamine and paraformaldehyde as disclosed in synthetic example 1 of J.P. KOKAI No. 59-78340.

Binder-1 is 2-hydroxyethyl methacrylate/acrylonitrile/methyl methacrylate/methacrylic acid copolymer (weight ratio 50/20/26/4, average molecular weight 75,000, acid value 26) which is a water insoluble, aqueous alkali soluble film-forming high molecule.

Pivaloyl group-containing compound-1 is poly-p-hydroxystyrene (average molecular weight 5,000) pyvalic ester (esterification rate 83 mole %).

This presensitized plate was imagewise exposed to light, developed in DN-3C (an aqueous alkali solution type developing solution manufactured by FUJI PHOTO FILM CO., LTD.) water-diluted to 1:1, washed with water and dried.

On the next day, printing papers were printed by a KOR-D printing machine (manufactured by HEIDELBERG CO.) set up with the resulting printing plate at a printing speed of 6,000 revolutions/hour, and as a result a printed sheets having an adequate ink density was obtained from the 9th printing paper.

When a printing plate obtained from a composition having the same composition with light-sensitive composition A except for the omission pivaloyl groups-containing compound-1 was used in place of the above printing plate, 30 sheets or more of printing paper were required to obtain a printed sheet having an adequate ink density.

EXAMPLES 2 to 6

Presensitized plates were made in the same manner as in Example 1 except that in place of pivaloyl groups containing compound-1 other pivaloyl groups-containing compounds were used respectively. Lithographic printing plates were made from the presensitized plates respectively and subjected to printing, both in the same manner as in Example 1. The results and shown in Table 1.

EXAMPLES 7 to 9

Presensitized plates were made in the same manner as in Example 1 except that p-hydroxy-α-methyl-styrene/acrylonitrile copolymer (copolymerization weight ratio 5/2, average molecular weight 4,000) pivalic ester (esterification rate 60%, compound 7) was used in place of pivaloyl groups-containing compound-1 and various polymers were used in place of binder 1. Lithographic printing plates were made from the presensitized plates and subjected to printing, in the same manner as in Example 1. The results are shown in Table 2.

TABLE 2

|  | Binder | Sheet number at which an adequate ink concentration was obtained Presence or absence of compound 7 | |
|---|---|---|---|
|  |  | Present | Absent |
| Example 7 | 2-Hydroxyethyl methacrylate/acrylonitrile/ethyl methacrylate/methacrylic acid copolymer (copolymerization ratio 45/15/36/4 average molecular weight 120,000) | 8 | 15 |
| Example 8 | Hydroxyethylated compound of 4,4'-diphenylmethane diisocyanate/1,6-hexamethylene diisocyanate/2,2-bis(hydroxymethyl)propionic acid (molar ratio 60/40/100) polyaddition compound, (average molecular weight 45,000, carboxylic acid content 1.20 m equivalent/g) | 9 | 30 |
| Example 9 | N—(p-hydroxyphenyl) methacrylamide/2-hydroxyethyl methacrylate/acrylonitrile/ethyl methacrylate/methacrylic acid copolymer (copolymerization ratio 10/20/25/35/10, average molecular weight 60,000) | 10 | 17 |

EXAMPLES 10 to 12

Presensitized plates were made in the same manner as in Example 1 except that the following light-sensitive compositions B were used in place of light-sensitive composition A. Lithographic printing plates were made from the presensitized plates and subjected to printing, in the same manner as in Example 1. The results are shown in Table 3.

| Light-sensitive composition B | |
|---|---|
| Binder (as shown in Table 3) | 5.0 g |
| Diazo resin-2 | 0.5 g |
| Pivaloyl groups-containing compound-10 | 0.15 g |
| Victoria Pure Blue-BOH | 0.15 g |

TABLE 1

|  | Pivaloyl groups-containing compound | Added amount | Sheet number at which an adequate ink concentration was obtained |
|---|---|---|---|
| Example 2 | Pivalic ester of p-cresol-formalin resin (average molecular weight 3,000, esterification rate 50%) | 0.5 g | 11 |
| Example 3 | Pivalic ester of pyrogallol-acetone resin (average molecular weight 2,500, esterification rate: 17% of total hydroxyl groups) | 0.5 g | 10 |
| Example 4 | Pivalic ester of bisphenol A | 1.0 g | 12 |
| Example 5 | Vinyl pivalate/vinyl acetate copolymer (copolymerization molar ratio 3/7, average molecular weight 20,000) | 0.1 g | 13 |
| Example 6 | Pivalic ester of poly-p-hydroxystyrene (average molecular weight 20,000, esterification rate 40 mole %) | 0.05 g | 10 |
| Comparitive Example 1 | Benzoic ester of poly-p-hydroxystyrene (average molecular weight 20,000, esterification rate 40 mole %) | 0.05 g | 30 or more |

| Sodium naphthalenesulfonate | 0.1 g |
|---|---|
| Dipicolinic acid | 0.1 g |
| Surfactant | 0.05 g |
| Propylene glycol monomethyl ether | 60 g |
| Methanol | 20 g |
| Methyl ethyl ketone | 40 g |

In the above, diazo resin-2 is n-dodecylbenzensulfonate of a condensate of D-diazodiphenylamine and para-formaldehyde (containing about 30 mole % of hexamer or more); pivaloyl group-containing compound-10 is poly-p-hydroxystyrene (average molecular weight 7,000) pivalic ester (esterification rate 50%); and the surfactant is an N-butylperfluorooctanesulfonamidoethyl (oxypropylene) acrylate copolymer (weight ratio 20/80).

TABLE 3

| | | Sheet number at which an adequate ink concentration was obtained Presence or absence of compound-10 | |
|---|---|---|---|
| | Binder | Present | Absent |
| Example 10 | Binder of Example 7 | 8 | 16 |
| Example 11 | Binder of Example 8 | 9 | 28 |
| Example 12 | Binder of Example 9 | 9 | 17 |

The above results reveal that addition of pivaloyl group-containing compounds is effective for enhancement of ink receptivity.

What is claimed is:

1. A light-sensitive composition comprising a mixture of (i) about 3 to about 30 weight % of a light-sensitive diazo resin of a condensate of an aromatic diazonium salt and an active carbonyl compound, (ii) about 70 to about 97 weight % of a binder of a substantially water-insoluble and film-forming organic high molecular weight compound having an acid value of about 10 to about 200, and (iii) about 0.1 to about 50 weight % based on the binder of a compound having a pivaloyl group selected from the group consisting of pivaloyloxystryene unit- or pivaloyloxy-α-methylstryene unit-containing polymers, vinyl pivalate unit-containing polymers, pivalic esters of phenol resins, pivalic esters of a condensate of a polyphenol and a ketone, and bispivalic esters of bisphenols.

2. The light-sensitive composition of claim 1, wherein the compound is one obtained by pivaloylating a compound having groups reactive to a pivalic acid derivative.

3. The light-sensitive composition of claim 1, wherein the compound is a polymer containing monomer units having a pivaloyl group.

4. The light-sensitive composition of claim 1, wherein said composition comprising a pivalic ester of a homopolymer of phydroxystryene or p-hydroxy-α-methylstryene, or a copolymer thereof with a copolymerizable monomer, or a homopolymer or copolymer of vinyl pivalate, or a pivalic ester of a polymer containing vinyl alcohol units.

5. The light-sensitive composition of claim 1, wherein the molecular weight of each polymer is 500 to 50,000.

6. The light-sensitive composition of claim 1, wherein the light-sensitive diazo resin is selected from the group consisting of an organic solvent soluble diazo resin inorganic acid salt which is a reaction product of a condensate of p-diazodiphenylamine and an aldehyde with a hexafluorophosphate or tetrafluoroborate; an organic solvent soluble diazo resin organic acid salt which is a reaction product of the above condensate with a sulfonic acid or a salt thereof; a diazo compound of high molecular weight containing 20 mole % or more of hexamer or more; and a compound obtained by condensing 3-methoxy-4-diazodiphenylamine with 4-4'-bis-methoxymethyldiphenyl ether and converting the condensate to a salt with mesitylenesulfonic acid.

7. The light-sensitive composition of claim 1, wherein the binder is an organic high molecular compound which has an acid value of 10 to 200, is insoluble in neutral or acidic aqueous solutions, has a film-forming property, is capable of dissolving or swelling in aqueous alkali solution series developing solutions, and is capable of being photohardened in coexistance with the light-sensitive diazo resin whereby it is converted to a compound insoluble or not swelling in the developing solutions.

8. A presensitized plate having on an aluminum support a light - sensitive composition comprising a mixture of (i) about 3 to about 30 weight % of a light-sensitive diazo resin of a condensate of an aromatic diazonium salt and an active carbonyl compound, (ii) about 70 to about 97 weight % of a binder of a substantially water-insoluble and film-forming organic high molecular weight compound having an acid value of about 10 to about 200, and (iii) about 0.1 to about 50 weight % based on the binder of a compound having a pivaloyl group selected from the group consisting of pivaloyloxystryene unit-or pivaloyloxy-α-methylstryene unit-containing polymers, vinyl pivalate unit-containing polymers, pivalic esters of phenol resins, pivalic esters of a condensate of a polyphenol and a ketone, and bispivalic esters of bisphenols.

9. A presensitized plate according to claim 8, wherein the surface of the aluminum substrate is made hydrophilic by hydrophilizing treatment.

10. A presensitized plate according to claim 8, wherein the compound having a pivaloyl group is obtained by pivaloylating a compound having groups reactive to a pivalic acid derivative.

11. A presensitized plate according to claim 8, wherein the compound having a pivaloyl group is a polymer containing monomer units having a pivaloyl group.

12. A presensitized plate according to claim 8, wherein said composition comprises a pivalic ester of a homopolymer of p-hydroxystryene of p-hydroxy-α-methylstryene, or a copolymer thereof with a copolymerizable monomer, or a homopolymer or copolymer of vinyl pivalate, or a pivalic ester of a polymer containing vinyl alcohol units.

13. A presensitized plate according to claim 8, wherein the molecular weight of each polymer is 500 to 50,000.

14. A presenaitized plate according to claim 8, wherein the light sensitive diazo resin is selected from the group consisting of organic solvent soluble diazo resin inorganic acid salts which are reaction products of a condensate of p-diazodiphenylamine and an aldehyde with a hexafluorophosphate or tetrafluoroborate; organic solvent soluble diazo resin organic acid salts which are reaction products of said condensate with a sulfonic acid or a salt thereof; diazo compounds of high molecular weight containing 20 mole % or more of hexamer or more; and compounds obtained by condensing 3-methoxy-4-diazodiphenylamine with 4-4,-bis-methoxymethyldiphenyl ether and converting the condensate to a salt with mesitylenesulfonic acid.

* * * * *